United States Patent
Sun et al.

(10) Patent No.: US 8,979,458 B2
(45) Date of Patent: Mar. 17, 2015

(54) HEAT DISSIPATION DEVICE HAVING FASTENER

(71) Applicants: Jian Sun, KunShan (CN); Ming-Tang Zhang, KunShan (CN); Xi-Yuan Shen, KunShan (CN); Wei-Hsiang Chang, New Taipei (TW)

(72) Inventors: Jian Sun, KunShan (CN); Ming-Tang Zhang, KunShan (CN); Xi-Yuan Shen, KunShan (CN); Wei-Hsiang Chang, New Taipei (TW)

(73) Assignees: Furui Precise Component (Kunshan) Co., Ltd., Kunshan (CN); Foxconn Technology Co., Ltd., New Taipei (TW)

(*) Notice: Subject to any disclaimer, the term of this patent is extended or adjusted under 35 U.S.C. 154(b) by 133 days.

(21) Appl. No.: 13/664,426

(22) Filed: Oct. 31, 2012

(65) Prior Publication Data
US 2014/0060791 A1 Mar. 6, 2014

(30) Foreign Application Priority Data
Aug. 31, 2012 (CN) .......................... 2012 1 0317486

(51) Int. Cl.
*F16B 41/00* (2006.01)
*F16B 5/02* (2006.01)

(52) U.S. Cl.
CPC ............. *F16B 41/002* (2013.01); *F16B 5/0241* (2013.01); *Y10S 411/999* (2013.01)
USPC .......................................... 411/353; 411/999

(58) Field of Classification Search
CPC ...... F16B 41/002; F16B 5/002; F16B 5/0241; F16B 5/0266
USPC .......................................... 411/999, 353, 107
See application file for complete search history.

(56) References Cited

U.S. PATENT DOCUMENTS

| 3,059,736 | A | * | 10/1962 | Boyd ................................ 403/7 |
| 3,114,405 | A | * | 12/1963 | Tait et al. ...................... 411/349 |
| 3,924,955 | A | * | 12/1975 | Barnett et al. ................ 403/230 |
| 6,468,011 | B2 | * | 10/2002 | Mayer ........................... 411/353 |
| 6,786,691 | B2 | * | 9/2004 | Alden, III .................. 411/371.2 |
| 7,701,720 | B2 | * | 4/2010 | Colbert et al. ................ 361/719 |
| 2003/0175091 | A1 | * | 9/2003 | Aukzemas et al. ........... 411/107 |
| 2009/0313804 | A1 | * | 12/2009 | Wang et al. ................ 29/525.11 |
| 2010/0071156 | A1 | | 3/2010 | Wang et al. |

FOREIGN PATENT DOCUMENTS

| JP | 2005277010 A | 10/2005 |
| JP | 2006147618 A | 6/2006 |
| JP | 3153408 U | 9/2009 |
| TW | 201000247 A | 1/2010 |
| TW | 201016105 A | 4/2010 |
| TW | M397117 U1 | 1/2011 |

* cited by examiner

*Primary Examiner* — Flemming Saether
(74) *Attorney, Agent, or Firm* — Novak Druce Connolly Bove + Quigg LLP

(57) ABSTRACT

A heat dissipation device includes a base and a fastener. The fastener includes a clasping portion, an elastic member placed and a first gasket. The clasping portion includes a fixing part, an operating part, and a connecting part connected to the fixing part and the operating part. The connecting part defines a slip groove. The first gasket interferingly fits the slip groove of the clasping portion. The elastic member is placed around the connecting part of the clasping portion and is arranged between the operation part and the first gasket. The first gasket abuts the base after the fixing part extending through the base.

6 Claims, 3 Drawing Sheets

HEAT DISSIPATION DEVICE HAVING FASTENER

BACKGROUND

1. Technical Field

The disclosure relates to heat dissipation devices, and particularly to a heat dissipation device having a fastener.

2. Description of Related Art

A heat dissipation device is often used to dissipate heat from heat generating components, such as an electronic element. A fastener is used to fix the heat dissipation device on the electronic element. A typical fastener includes a screw and a coil spring placed around the screw. The screw extends through a through hole of the heat dissipation device and threaded engages with a print circuit board; then the coil spring abuts to the heat dissipation device, and make the heat dissipation device contact to the heat generating components on the print circuit board. However, during assembly, the coil spring and the screw are easy to detach from the through hole of the heat dissipation device. Further, during operation, one end of the coil spring may deface an outer surface of the heat dissipation device because of the elastic force generated by the coil spring.

Therefore, what is needed is a heat dissipation device having a fastener which can overcome the above-described shortcomings.

DETAILED DESCRIPTION

Figure 1:
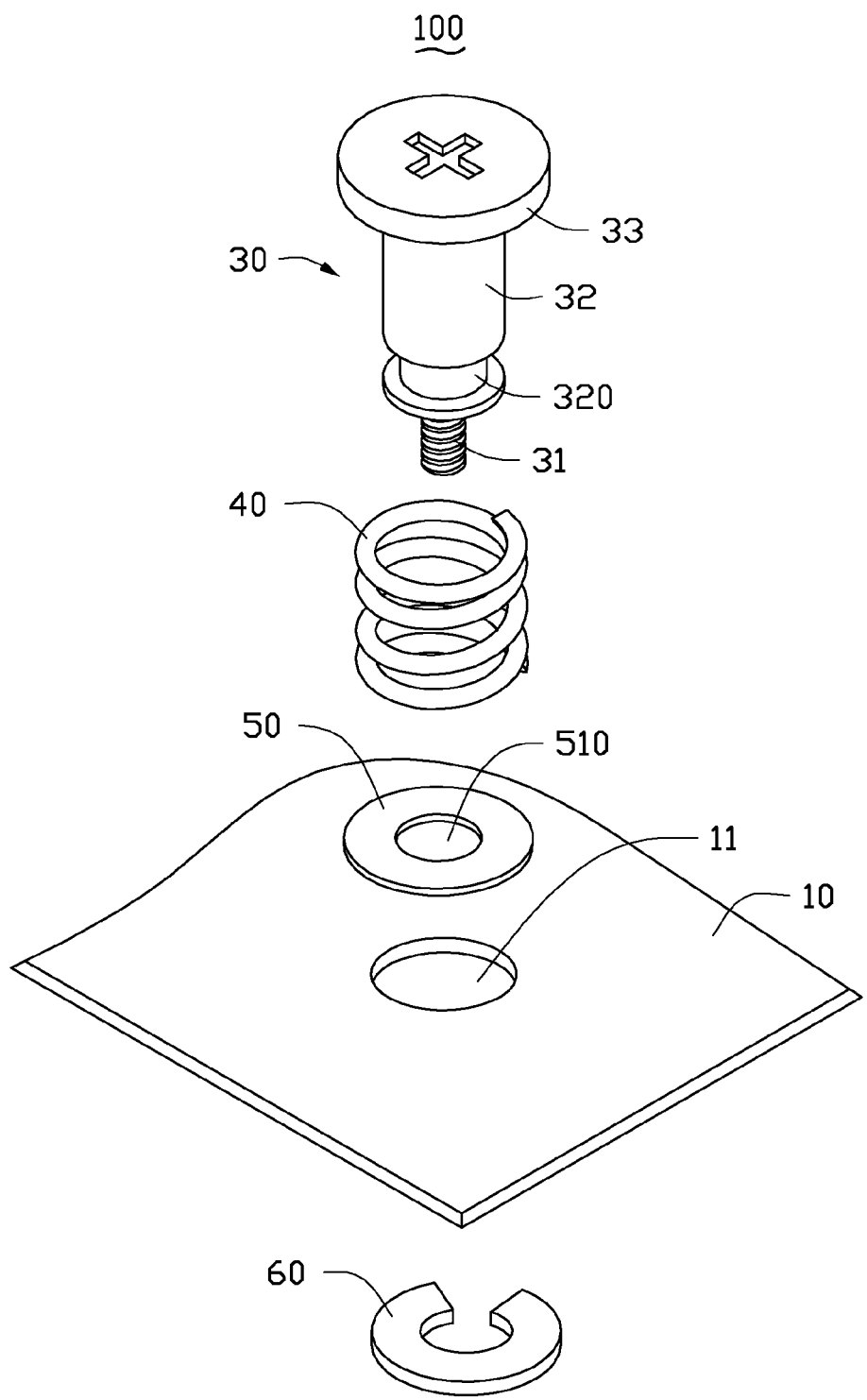
FIG. 1 is an exploded, isometric view of a heat dissipation device in accordance with an exemplary embodiment of the present disclosure.
Figure 2:
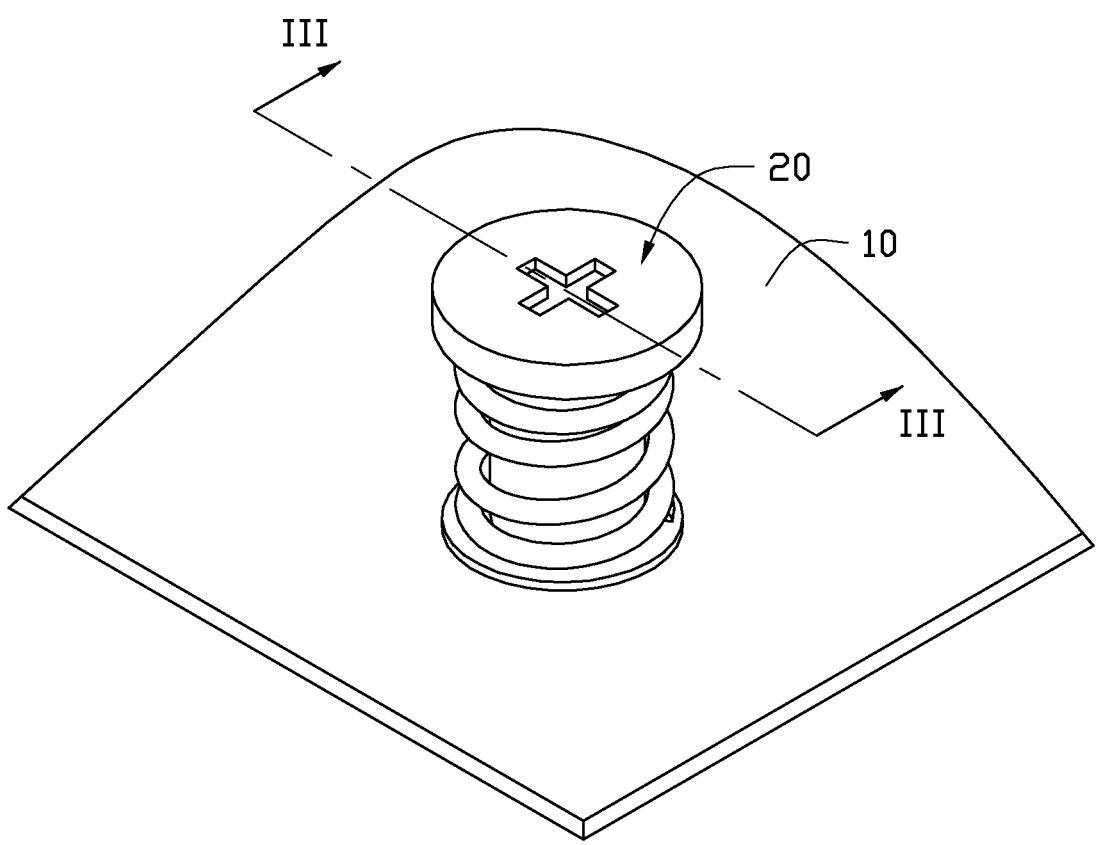
FIG. 2 is an assembled view of the heat dissipation device of FIG. 1.
Figure 3:
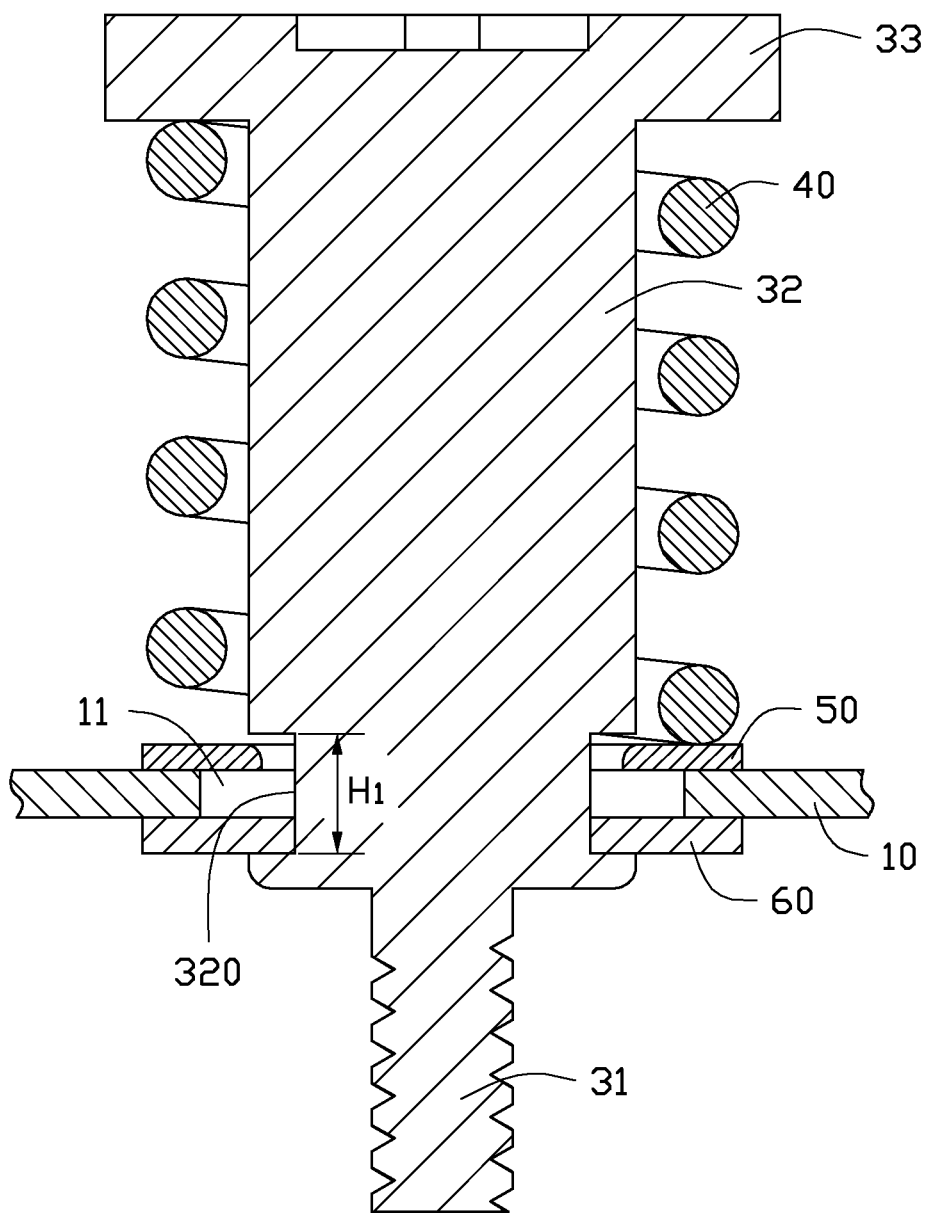
FIG. 3 is a cross-sectional view of the heat dissipation device of FIG. 2, taken along line III-III thereof.

Referring to FIGS. 1-3, an exemplary embodiment of a heat dissipation device 100 is shown. The heat dissipation device 100 includes a base 10 and a fastener 20. The fastener 20 is used to fix the heat dissipation device 100 on a printed circuit board (not shown) with at least one electronic element (not shown), and make the base 10 thermally contact the electronic element. The base 10 defines an installing hole 11 corresponding to the fastener 20. It is understood that number of the fastener 20 and the installing hole 11 may be plural to secure the heat dissipation device 100 on the printed circuit board.

The fastener 20 includes a clasping portion 30, an elastic member 40 placed around the clasping portion 30, a first gasket 50, and a second gasket 60. The clasping portion 30 includes a fixing part 31, a disk-shaped operating part 33, and a connecting part 32 connected to the fixing part 31 and the operating part 33. The connecting part 32 perpendicularly extends from a center of the operating part 33. A diameter of the connecting part 32 is less than that of the operating part 33. The fixing part 31 extends from one end portion of the connecting part 32 away from the operating part 33, and a diameter of the fixing part 31 is less than that of the connecting part 32. The fixing part 31 is cylindrical-shaped, and has threads thereon. The fixing part 31 is used to fix the heat dissipation device 100 on the printed circuit board. The connecting part 32 defines a slip groove 320 at a bottom thereof and near the fixing part 31. A thickness $H_1$ of the slip groove 320 is larger than that of the base 10. In the present embodiment, the bottom portion of the connecting part 32 is rounding.

In the present embodiment, the elastic member 40 is a spring. The elastic member 40 is placed around the connecting part 32 of the clasping portion 30. An inner diameter of the elastic member 40 is larger than the diameter of the connecting part 32, and an outer diameter of the elastic member 40 is less than the diameter of the operating part 33 of the clasping portion 30. The first gasket 50 is O-shaped, in other words, the first gasket 50 is annular, and defines a through hole 510 at a center thereof. The outer diameter of the elastic member 40 is less than the diameter of the first gasket 50. An inner diameter of the through hole 510 is larger than the diameter of the bottom portion of the connecting part 32 where the slip groove 320 is formed, and less than the diameter of the connecting part 32 of the clasping portion 30. A top portion of the first gasket 50 near the through hole 510 is rounded for facilitating assembly of the first gasket 50 on the connecting part 32. The second gasket 60 is C-shaped.

During assembly, the elastic member 40 is placed around the connecting part 32 of the clasping portion 30, the connecting part 32 is interferingly inserted through the first gasket 50 till the first gasket 50 is received in the slip groove 320 of the clasping portion 30. The fixing part 31 and part of the connecting part 32 of the clasping portion 30 extend through the installing hole 11 of the base 10, until a top surface of the base 10 abuts a bottom face of the first gasket 50. The second gasket 60 is engagingly received in a bottom portion of the slip groove 320 of the clasping portion 30, and a bottom face of the base 10 abuts a top face of the second gasket 60. Therefore, the second gasket 60 prevents the elastic member 40 and the clasping portion 30 detaching from the base 10.

Further, for the first gasket 50 is arranged between the base 10 and the clasping portion 30, the top face of the base 10 could be prevented from being defaced by the corresponding end of the elastic portion 40 during and after assembly.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
a base; and
a fastener comprising a clasping portion, an elastic member placed around the clasping portion and a first gasket, the clasping portion comprising a fixing part, an operating part, and a connecting part connected to the fixing part and the operating part, a slip groove defined on the connecting part, the connecting part being interferingly inserted through the first gasket until the first gasket being received in the slip groove of the clasping portion, the elastic member placed around the connecting part of the clasping portion and being arranged between the operation part and the first gasket, the first gasket abutting the base, the fixing part extending through the base, and a top portion of the first gasket being rounded near a through hole, the fastener further comprising a second gasket, the second gasket clipping the slip groove, the fixing part and part of the connecting part extending through the base to secure the clasping portion on the base.

2. The heat dissipation device of claim 1, wherein the second gasket is C-shaped.

3. The heat dissipation device of claim 1, wherein a thickness of the slip groove is larger than that of the base.

4. A heat dissipation device comprising:
   a base defining an installing hole; and
   a fastener comprising a clasping portion, an elastic member placed around the clasping portion and a first gasket, the clasping portion comprising a fixing part, an operating part, and a connecting part connected to the fixing part and the operating part, a slip groove defined on the connecting part, the connecting part being interferingly inserted through the first gasket until the first gasket being received in the slip groove of the clasping portion, the elastic member placed around the connecting part of the clasping portion and being arranged between the operation part and the first gasket, the fixing part extending through the installing hole of the base, a bottom face of the first gasket abutting a top face of the base, and a top portion of the first gasket being rounded near a through hole, the fastener further comprising a second gasket, the second gasket clipping the slip groove, the fixing part and part of the connecting part extending through the base to secure the clasping portion on the base.

5. The heat dissipation device of claim 4, wherein the second gasket is C-shaped.

6. The heat dissipation device of claim 4, wherein a thickness of the slip groove is larger than that of the base.

* * * * *